United States Patent [19]

Keller et al.

[11] Patent Number: 5,073,507
[45] Date of Patent: Dec. 17, 1991

[54] PRODUCING A PLASMA CONTAINING BERYLLIUM AND BERYLLIUM FLUORIDE

[75] Inventors: Charles T. Keller, Tempe; Schyi-Yi Wu, Mesa, both of Ariz.

[73] Assignee: Motorola, Inc., Schaumburg, Ill.

[21] Appl. No.: 664,142

[22] Filed: Mar. 4, 1991

[51] Int. Cl.$^5$ .................. H01L 21/00; H01L 21/02; H01L 21/306

[52] U.S. Cl. ........................ 437/22; 437/20; 437/21; 437/23; 437/27; 148/DIG. 83; 148/DIG. 84; 250/493.1

[58] Field of Search ............... 437/20, 21, 22, 23, 437/27; 148/DIG. 82, DIG. 83, DIG. 84; 156/643, 646; 204/192.11, 192.12; 427/38, 39

[56] References Cited

U.S. PATENT DOCUMENTS

| | | | |
|---|---|---|---|
| 3,684,667 | 8/1972 | Sayce | 204/62 |
| 4,502,898 | 3/1985 | Camlibel et al. | 437/161 |
| 4,558,509 | 12/1985 | Tiwari | 437/22 |
| 4,732,870 | 3/1988 | Mimura | 437/40 |
| 4,843,033 | 6/1989 | Plumton et al. | 437/160 |
| 4,868,633 | 9/1989 | Plumton et al. | 357/34 |
| 4,883,686 | 12/1989 | Doehler et al. | 427/38 |
| 4,889,824 | 12/1989 | Selle et al. | 437/32 |
| 4,904,616 | 2/1990 | Bohling et al. | 437/81 |
| 4,937,094 | 6/1990 | Doehler et al. | 427/38 |
| 4,988,640 | 1/1991 | Bohling et al. | 437/81 |

FOREIGN PATENT DOCUMENTS

| | | |
|---|---|---|
| 0288083 | 11/1988 | Japan. |
| 0122172 | 5/1989 | Japan. |
| 0143267 | 6/1989 | Japan. |
| 0208867 | 8/1989 | Japan. |

OTHER PUBLICATIONS

Hallali, P., Effect of F Co-Implant During Annealing of Be-Implanted GaAs, Appl. Phys. Lett. (U.S.A.), vol. 57, No. 6, Aug. 6, 1990, pp. 569-571.

*Primary Examiner*—Olik Chaudhuri
*Assistant Examiner*—B. Everhart
*Attorney, Agent, or Firm*—Joe E. Barbee; Robert M. Handy

[57] ABSTRACT

A plasma containing both beryllium ions and beryllium fluoride ions is achieved. Beryllium crystals are used as a cathode in an ionization chamber containing boron trifluoride gas. The boron trifluoride gas and the beryllium are ionized to produce both beryllium fluoride ions (BeF+) and beryllium ions (Be+). Beryllium fluoride ions are emitted to impact a semiconductor target and where they divide thereby implanting beryllium and fluorine.

9 Claims, No Drawings

PRODUCING A PLASMA CONTAINING BERYLLIUM AND BERYLLIUM FLUORIDE

BACKGROUND OF THE INVENTION

The present invention relates, in general, to producing plasmas, and more particularly, to a novel method for producing a plasma containing both beryllium ions and beryllium fluoride ions.

In the past, implanting beryllium (Be) into semiconductor materials had been difficult to achieve. Two primary methods were used to produce beryllium ions which could then be implanted into semiconductor materials. In general, the two techniques utilized an ion implanter's ionization chamber to produce beryllium ions, and then used the implanter's accelerator to emit the beryllium ions at a semiconductor material target thereby implanting them into the target. Equipment preparation for both methods was very time consuming, and could take four to six hours.

One of the methods produced beryllium ions from beryllium crystals. The crystals were used in the ionization chamber as its' cathode while an inert gas, typically argon, was used in the ionization chamber as an ionization agent. The gas was ionized causing it to bombard the beryllium cathode and create beryllium ions. The beryllium ions were then implanted into the semiconductor material. Generation of beryllium ions was very slow as indicated by the low value of beam current, typically 10 nanoamps. per square centimeter, produced during the procedure. With such a low beam current, it took several hours to implant adequate concentrations of beryllium ions into the semiconductor material. In addition to being low, the beam current was also very unstable and fluctuated during implanting operations. As a result, the implanting equipment had to be constantly monitored and adjusted to provide consistent implanting of the beryllium ions. Therefore, this method of generating beryllium ions resulted in time consuming equipment preparation, low beam currents, and unstable beam currents.

Another method of obtaining beryllium ions utilized a standard tantalum cathode instead of a beryllium cathode to create the plasma. Beryllium chloride ($BeCl_2$) crystals were heated to produce beryllium chloride gas, then an ionization agent, typically argon, was ionized to activate the beryllium chloride gas thereby producing beryllium ions which were then implanted into the semiconductor material. Since beryllium chloride was more volatile than beryllium, it was easier to ionize and produced a higher and a stabler beam current than was produced using beryllium crystals as a source. But, beryllium chloride easily hydrolyzed to form hydrochloric acid which was very corrosive and damaged the ion implanting equipment. Therefore, the use of beryllium chloride as a source of beryllium ions not only resulted in time consuming equipment preparation, it also produced corrosive acids which damaged the implanting equipment.

Once beryllium was implanted as a P-type dopant into a semiconductor material, it had a high migration rate within the material. As various semiconductor processing steps exposed the implanted material to elevated temperatures, the beryllium easily migrated out of the areas into which it was implanted. Consequently, a material such as fluorine was used to lockup the beryllium and increase the energy required to activate or create migration of the implanted beryllium. A separate implant operation subsequent to the beryllium implant was used to implant the fluorine. Using a separate fluorine implant operation increased manufacturing costs of semiconductor devices that used beryllium as a dopant.

Accordingly it is desirable to have a method for implanting beryllium that is not corrosive, that has an easily controlled beam current, that has minimal equipment preparation procedures, and that permits simultaneous implanting of both beryllium and fluorine.

SUMMARY OF THE INVENTION

Briefly stated, the present invention is achieved by creating a plasma containing both beryllium ions and beryllium fluoride ions. Beryllium crystals are used as a cathode in an ionization chamber containing boron trifluoride gas. The boron trifluoride gas and the beryllium are ionized to produce both beryllium fluoride ions ($BeF^+$) and beryllium ions ($Be^+$). Beryllium fluoride ions are emitted to impact a semiconductor target where they divide thereby implanting beryllium and fluorine.

DETAILED DESCRIPTION

The present invention provides a plasma that includes beryllium fluoride ions as well as beryllium ions. The plasma can be used as a source for simultaneously implanting beryllium and fluorine into a semiconductor material, and can also be a source for implanting beryllium ions only. While the invention is described with specific preferred embodiments, it is evident that many alternatives and variations will be apparent to those skilled in the semiconductor art. More specifically the invention has been described for producing ions of particular P-type dopants using beryllium or magnesium cathode material, although the method is directly applicable to other dopants, by using other cathode materials and other ionization gases.

It has been found that in a plasma environment beryllium reacts with most of the common fluorine species gases to produce a plasma containing beryllium fluoride ions ($BeF^+$) as well as beryllium ions ($Be^+$) Some of the common fluorine species gases are often used in processing semiconductor devices and are readily available. Such gases include nitrogen trifluoride ($NF_3$), boron trifluoride ($BF_3$), hydrogen fluoride (HF), silicon tetrafluoride ($SiF_4$), and fluorine ($F_2$). An equation illustrating a portion of the reaction of gaseous boron trifluoride with beryllium in a plasma environment is shown below:

$$Be + BF_3 \rightarrow BeF^+ + Be^+ + B^+ + TO.$$

The "+" superscript indicates ions of the atoms or molecules, and TO indicates other elements or compounds that are also formed by the reaction. As shown by the equation, the reaction of gaseous boron trifluoride with beryllium produces not only beryllium fluoride ions, but also beryllium ions. Boron ($B^+$) ions are also produced and could be used if they were needed.

In the above equation, boron trifluoride can be substituted with another fluorine species gasses (e.g. $F_2$, HF, $SiF_4$, $NF_3$, etc.) in a plasma environment to yield equivalent products of the equation. For example, a reaction with gaseous silicon tetrafluoride yields beryllium fluoride ions, beryllium ions, silicon fluoride gas ($SiF_2$), and other by-products as shown by the equation below:

$$Be + SiF_4 \rightarrow BeF^+ + Be^+ + SiF_2 + TO.$$

These same gasses can also be combined in a plasma environment with other elements to form ionized fluorides of other P-type dopants. These fluorides are produced by replacing beryllium with other elements from group II of the Periodic Table of Elements. Like beryllium, each of these elements (magnesium, Mg; calcium, Ca; strontium, Sr; barium, Ba; radium, Ra; zinc, Zn; cadmium, Cd; mercury, Hg) have an oxidation state of two (2) and react with fluorine species gases in a manner similar to beryllium. As an example, the plasma environment reaction of magnesium (Mg) with hydrogen fluoride gas (HF) is shown below:

$$Mg + HF \rightarrow MgF^+ + Mg^+ + H^+ + TO.$$

Hydrogen fluoride gas can hydrolyze into hydrofluoric acid. In an ionization chamber, hydrofluoric acid reacts with metal components and creates a metal fluoride surface coating on the components. This metal fluoride generally is inert and once it forms, reactions with the metal components cease. Therefore, hydrogen fluoride is suitable for generating a plasma containing a fluoride of a P-type dopant as illustrated by the above equation even though it can create an acid.

One use for these plasmas is producing ions for implanting P-type dopants into semiconductor materials. For this application, the plasma reactions are produced in an ionization chamber of a standard ion implanter that uses a unique combination of ionization gas and cathode material. The ionization chamber includes an anode and a cathode which are used to create a plasma, and an orifice through which the plasma can exit the chamber. An accelerator, which is a means for emitting ions from the implanter, accelerates the ions to a high velocity and emits them at a semiconductor material target. The accelerator typically accelerates ions by attracting them through a series of plates to which a high voltage is applied. Since a plasma contains several types of ions, as shown by the reaction equations, the implanter has a means for selecting a particular type of ion to be emitted from the plasma. The means for selecting is generally a mass analyzer that permits selecting ions of a particular mass to pass through the analyzer to the accelerator, and prevent passing nonselected ions. As an example, consider the reaction equation of beryllium with gaseous boron trifluoride ($Be + BF_3 \rightarrow BeF^+ + Be^+ + B^+ + TO$) Both beryllium fluoride ions and beryllium ions are in the plasma, and both can be used as p-type dopants. Since beryllium fluoride has a mass of 28 and beryllium has a mass of 9, the mass analyzer can select one to be emitted from the ion implanter. This method of implanting beryllium ions produces a beam current of approximately 100 nanoamps. per square cm. which is adequate for implanting concentrations of up to approximately $2 \times 10^{14}$ ions per square cm. in a short period of time. Such concentrations typically are utilized to produce buried layers in addition to other portions of III-V semiconductor devices. If the beryllium fluoride ions ($BeF^+$) are selected, they are emitted and strike the semiconductor material where the beryllium fluoride ion separates into beryllium and fluorine both of which penetrate into the semiconductor material. Since the beryllium fluoride ion ($BeF^+$) has a charge of plus one, the sum of the charges after it splits must also be plus one. Consequently, the beryllium fluoride ion splits to form either a beryllium ion ($Be^+$) and an atom of fluorine (F), or an atom of beryllium (Be) and a fluorine ion ($F^+$). The implanted beryllium, whether an ion or an atom, forms a P-type dopant in the semiconductor material while the fluorine, whether an ion or an atom, minimizes out diffusion of the beryllium during subsequent processing steps. Simultaneously implanting beryllium and fluorine in this manner produces a beam current of approximately 550 nanoamps. per square cm. which is adequate to provide concentrations of up to approximately $2 \times 10^{15}$ ions per square cm. Beryllium and fluorine at these concentrations is suitable for implanting the shallow source and drain areas required to produce III-V semiconductor devices, and is also suitable for providing highly doped areas for making ohmic contacts Simultaneously implanting both beryllium and fluorine eliminates separate fluorine implants that were previously required to obtain both beryllium and fluorine dopants in III-V semiconductor materials.

By now it should be appreciated that there has been provided a novel way to produce a plasma containing beryllium fluoride ions and beryllium ions. The technique provides a plasma that does not corrode the metallic parts of an ion implanter. The invention provides stable beam currents that are easily controlled during implanting of dopants from a plasma source. Equipment initialization and preparation is simple and can be readily completed in a short period of time.

What is claimed is:

1. A method of simultaneously implanting beryllium ions and fluorine ions into a III-V semiconductor material which comprises:

providing a III-V semiconductor material;

providing a means for implanting ions into the semiconductor material with the means for implanting having an ionization chamber for ionizing materials, and also having a means for emitting ions of a predetermined type from the ionization chamber;

providing a beryllium cathode in the ionization chamber;

releasing a boron trifluoride gas into the ionization chamber;

ionizing the boron trifluoride gas for the purpose of sputtering beryllium from the ceryllium cathode and producing at least beryllium fluoride ions ($BeF^+$) in the ionization chamber;

emitting the beryllium fluoride ions from the means for implanting into the III-V semiconductor material; and separating the beryllium fluoride ions into beryllium and fluorine that penetrate into the semiconductor material.

2. The method of claim 1 wherein separating the beryllium fluoride ions includes impinging the beryllium fluoride ions onto a surface of the III-V semiconductor material wherein the beryllium fluoride ions separate on impact with the III-V semiconductor material.

3. The method of claim 1 wherein separating the beryllium fluoride ions into beryllium and fluorine includes separating a first portion of the beryllium fluoride ions ($BeF^+$) into beryllium ions ($Be^+$) and fluorine atoms (F), and a second portion of the beryllium fluoride ions into beryllium atoms (Be) and fluorine ions ($F^+$).

4. A method of generating a plasma having ions of beryllium and ions of beryllium fluoride molecules suitable for implanting into semiconductor materials which comprises:

providing an ionization chamber for ionizing materials;
providing a beryllium cathode in the ionization chamber;
releasing a fluorine species gas into the ionization chamber;
ionizing the fluorine species gas for the purpose of ionizing beryllium from the beryllium cathode and producing at least beryllium ions (Be$^+$) and beryllium fluoride ions (BeF$^+$) in the ionization chamber.

5. The method of claim 4 wherein the releasing a fluorine species gas into the ionization chamber includes releasing into the ionization chamber a gas selected from the group including boron trifluoride, nitrogen trifluoride, hydrogen fluoride, silicon tetrafluoride, and fluorine.

6. A method of producing a plasma which comprises:
providing an ionization chamber for ionizing materials;
providing a cathode in the ionization chamber wherein the cathode is a material selected from the group including beryllium, magnesium, calcium, strontium, barium, radium, zinc, cadmium, and mercury;
releasing a fluorine species gas into the chamber; and
ionizing the fluorine species gas for the purpose of ionizing material from the cathode and producing at least ions that are fluorides of the cathode material 7. The method of claim 6 wherein releasing a fluorine species gas includes releasing a gas selected from the group including nitrogen trifluoride, boron trifluoride, hydrogen fluoride, silicon tetrafluoride, and fluorine.

8. A method of simultaneously implanting beryllium and fluorine into a semiconductor substrate, comprising:
using beryllium crystals as a cathode in an ionization chamber containing boron trifluoride gas;
ionizing the boron trifluoride gas and the beryllium to form at least beryllium fluoride ions; and
emitting the beryllium fluoride ions into the semiconductor substrate where the ions divide thereby simultaneously implanting beryllium and fluorine.

9. The method of claim 8 wherein emitting the beryllium fluoride ions into the semiconductor substrate includes separating a first portion of the beryllium fluoride ions (BeF$^+$) into beryllium ions (Be$^+$) and fluorine atoms (F), and a second portion of the beryllium fluoride ions into beryllium atoms (Be) and fluorine ions (F$^+$).

* * * * *